United States Patent
Joshi

(10) Patent No.: US 7,892,884 B2
(45) Date of Patent: *Feb. 22, 2011

(54) HIGH PERFORMANCE MULTI-CHIP FLIP CHIP PACKAGE

(75) Inventor: Rajeev Joshi, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 21 days.

This patent is subject to a terminal disclaimer.

(21) Appl. No.: 12/407,532

(22) Filed: Mar. 19, 2009

(65) Prior Publication Data

US 2009/0230540 A1 Sep. 17, 2009

Related U.S. Application Data

(60) Continuation of application No. 11/283,077, filed on Nov. 18, 2005, now Pat. No. 7,537,958, which is a continuation of application No. 10/741,217, filed on Dec. 19, 2003, now Pat. No. 6,992,384, which is a continuation of application No. 10/309,661, filed on Dec. 3, 2002, now Pat. No. 6,696,321, which is a division of application No. 09/285,191, filed on Mar. 15, 1999, now Pat. No. 6,489,678, which is a continuation-in-part of application No. 09/129,663, filed on Aug. 5, 1998, now Pat. No. 6,133,634.

(51) Int. Cl.
*H01L 21/44* (2006.01)
*H01L 21/48* (2006.01)
*H01L 21/50* (2006.01)

(52) U.S. Cl. .............. 438/106; 438/108; 438/127; 438/114

(58) Field of Classification Search .......... 438/106, 438/121, 111, 108, 124–127, 109, 110, 112, 438/113, 114, 123
See application file for complete search history.

(56) References Cited

U.S. PATENT DOCUMENTS

| | | |
|---|---|---|
| 3,561,107 A | 2/1971 | Best et al. |
| 3,871,014 A | 3/1975 | King et al. |
| 3,972,062 A | 7/1976 | Hopp |
| 4,021,838 A | 5/1977 | Warwick |
| 4,604,644 A | 8/1986 | Beckham et al. |
| 5,075,965 A | 12/1991 | Carey et al. |
| 5,217,922 A | 6/1993 | Akasaki et al. |
| 5,219,794 A | 6/1993 | Satoh et al. |
| 5,311,402 A | 5/1994 | Kobayashi et al. |

(Continued)

FOREIGN PATENT DOCUMENTS

JP 5-129516 5/1993

*Primary Examiner*—Chuong A. Luu
(74) *Attorney, Agent, or Firm*—Kilpatrick Townsend & Stockton LLP

(57) ABSTRACT

A structure and method of manufacture for an improved multi-chip semiconductor package that reduces package resistance to a negligible level, and offers superior thermal performance. Housing of multiple dies is facilitated by providing electrically isolated lead frames that are separated from a common base carrier by a non-conductive layer of laminating material. A silicon die is attached inside a cavity formed in each lead frame. Direct connection of the active surface of the silicon die to the printed circuit board is then made by an array of solder bumps that is distributed across the surface of each die as well as the edges of the lead frame adjacent to each die.

14 Claims, 4 Drawing Sheets

U.S. PATENT DOCUMENTS

| | | | |
|---|---|---|---|
| 5,313,366 A | 5/1994 | Gaudenzi et al. | |
| 5,367,435 A | 11/1994 | Andros et al. | |
| 5,371,404 A | 12/1994 | Juskey et al. | |
| 5,381,039 A | 1/1995 | Morrison | |
| 5,394,490 A | 2/1995 | Kato et al. | |
| 5,397,921 A | 3/1995 | Karnezos | |
| 5,409,865 A * | 4/1995 | Karnezos | 29/827 |
| 5,432,127 A | 7/1995 | Lamson et al. | |
| 5,447,886 A | 9/1995 | Rai | |
| 5,448,114 A | 9/1995 | Kondoh et al. | |
| 5,454,160 A | 10/1995 | Nickel | |
| 5,477,087 A | 12/1995 | Kawakita et al. | |
| 5,510,758 A | 4/1996 | Fujita et al. | |
| 5,512,786 A | 4/1996 | Imamura et al. | |
| 5,532,512 A | 7/1996 | Fillion et al. | |
| 5,547,740 A | 8/1996 | Higdon et al. | |
| 5,554,887 A | 9/1996 | Sawai et al. | |
| 5,578,869 A | 11/1996 | Hoffman et al. | |
| 5,654,590 A | 8/1997 | Kuramochi | |
| 5,665,996 A * | 9/1997 | Williams et al. | 257/401 |
| 5,703,405 A | 12/1997 | Zeber | |
| 5,714,792 A * | 2/1998 | Przano | 257/670 |
| 5,726,489 A | 3/1998 | Matsuda et al. | |
| 5,726,501 A | 3/1998 | Matsubara | |
| 5,726,502 A | 3/1998 | Beddingfield | |
| 5,729,440 A | 3/1998 | Jimarez et al. | |
| 5,734,201 A | 3/1998 | Djennas et al. | |
| 5,739,585 A | 4/1998 | Akram et al. | |
| 5,789,809 A | 8/1998 | Joshi | |
| 5,814,894 A | 9/1998 | Igarashi et al. | |
| 5,917,242 A * | 6/1999 | Ball | 257/737 |
| 6,133,634 A | 10/2000 | Joshi | |
| 6,294,403 B1 | 9/2001 | Joshi | |
| 6,307,775 B1 | 10/2001 | William et al. | |
| 6,423,623 B1 | 7/2002 | Bencuya et al. | |
| 6,489,678 B1 | 12/2002 | Joshi | |
| 6,624,522 B2 | 9/2003 | Standing et al. | |
| 6,627,991 B1 | 9/2003 | Joshi | |
| 6,696,321 B2 | 2/2004 | Joshi | |
| 6,992,384 B2 | 1/2006 | Joshi | |
| 7,537,958 B1 * | 5/2009 | Joshi | 438/106 |

* cited by examiner

HIGH PERFORMANCE MULTI-CHIP FLIP CHIP PACKAGE

CROSS-REFERENCE TO RELATED APPLICATIONS

This application is a continuation application of U.S. patent application Ser. No. 11/283,077, filed on Nov. 18, 2005 now U.S. Pat. No. 7,537,958, which is a continuation application of U.S. patent application Ser. No. 10/741,217, filed on Dec. 19, 2003 now U.S. Pat. No. 6,992,384, which is a continuation of U.S. patent application Ser. No. 10/309,661, filed on Dec. 3, 2002, now U.S. Pat. No. 6,696,321, which is a divisional of U.S. patent application Ser. No. 09/285,191, filed on Mar. 15, 1999, now U.S. Pat. No. 6,489,678, which is a continuation-in-part of U.S. patent application Ser. No. 09/129,663, filed Aug. 5, 1998, entitled "High Performance Flip Chip Package," now U.S. Pat. No. 6,133,634, the disclosures of which are all incorporated herein by reference.

BACKGROUND OF THE INVENTION

The present invention relates in general to semiconductor packaging and in particular to an apparatus and method of manufacture for a multi-chip high performance flip chip package for semiconductor devices.

While silicon process technology has advanced significantly in the past decade, for the most part, the same decades-old package technology continues as the primary packaging means. Epoxy or solder die attach along with aluminum or gold wire bonding to lead frame is still the preferred semiconductor packaging methodology. Advances in semiconductor processing technology, however, have made the parasitics associated with conventional packages more of a performance limiting factor. This is particularly true in the case of power switching devices where, as in the case of power MOSFETs, the on-resistance of these devices continues to push the lower limits. Thus, the parasitic resistance introduced by the bond wires and the lead frame in conventional packages becomes much more significant for such high current devices as power MOSFETs. Furthermore, the continuous shrinking of geometries and the resulting increase in chip densities has given rise to an increasing demand for semiconductor packages with lead counts higher than that offered by the conventional packaging techniques.

Ball grid array and flip chip technologies were developed to address some of these demands. Both of these packaging technologies provide for a more direct connection between the silicon die and the printed circuit board as well as providing for higher interconnect densities. There is always room for improvement however. For example, a typical ball grid array package consists of a BT resin laminated board which serves as an interposer layer between the silicon die and the printed circuit board (PCB). Because of poor heat dissipation from the laminated board, external heat sinks and additional PCB copper layers are often required to dissipate excess heat.

In the case of conventional flip chip technology, among other shortcomings, heat dissipation is essentially governed by the die size and connection to the back side of the die is not easily facilitated (often requiring a bond wire connection). These limitations—poor heat dissipation and resistive contact to back side—become quite significant in high current applications such as power switching devices. A substantial improvement in the performance of flip chip packages is offered by Bencuya et al. in commonly assigned provisional Patent Application No. 60/088,651, filed Jun. 9, 1998, entitled "Low Resistance Package for Semiconductor Devices." In one embodiment, this improved package eliminates wire bonding by making direct connection between an array of solder balls on one conductive surface of the die and a lead frame element, while connection to the opposite side is made by a die attach mechanism. This package exhibits significantly lower resistance; however, it still relies on a lead frame which adds residual resistance to the current path, and is not the smallest package possible for a given die size.

The desire to integrate increasing amounts of electronic circuitry into fewer separate components has led to multi-chip module (MCM) technology. The MCM technology allows two or more silicon chips to be mounted on a single carrier (or substrate) which is housed inside one package. The multiple chips on the common substrate can be interconnected using a variety of methodologies including face-up wire bonding, face-up tape automated bonding, and flip chip. The drawbacks associated with using flip chip interconnection in high current applications continue to persist in the MCM environment. The conventional MCM packaging introduces an additional problem in that the substrate upon which the multiple dies are mounted is common to all of the individual dies. An electrically common substrate severely limits the range of applications for the flip chip-connected MCM device. This is true, for example, in the case of power switching MOSFET devices discussed above. In these types of devices, the substrate or backside of each die acts as the drain terminal of the power MOSFET. An MCM carrier with an electrically common substrate, therefore, would not allow packaging of MOSFETs that require separate drain connections.

There is therefore a need for a high density semiconductor package whose attributes are minimal parasitic resistance and good heat dissipation, and that is readily manufacturable.

SUMMARY OF THE INVENTION

The present invention provides an improved multi-chip flip chip package that provides electrically isolated substrates, reduces package resistance to a negligible level, and offers superior thermal performance. Broadly, according to the present invention, a multi-chip carrier is provided that is made up of a first base layer separated from a second leadframe layer by a non-conductive laminating medium. The second leadframe layer is etched to form electrically isolated cavities to receive separate silicon dies. A silicon die is attached inside each cavity which is designed to surround the die along one or more edges of the die. Direct connection of the active surface of the silicon die to the printed circuit board is facilitated by an array of solder bumps that is distributed across the surface of each die as well as the edges of the leadframe layer surrounding each die. In one embodiment where connection to the back side of each die is required, the outer array of solder balls provide for low resistance electrical connection to the backside of each die that is attached to the leadframe layer. In applications where no connection to the back side of the die is required, the leadframe layer and the array of solder balls connecting to it may act as a thermal via for dissipating heat. Alternatively, the leadframe layer may be of dielectric material with selective conductive traces to make selective contact to traces on the board through the outer array of solder balls.

The multi-chip package of the present invention also reduces the number of steps required in the assembly process flow and is manufactured using standard materials and equipment. The resulting multi-chip package exhibits minimal resistance, improved heat dissipation, and is very thin and light as well as being cost-effective to manufacture. Furthermore, because of its construction, the multi-chip package of the present invention is able to withstand higher mechanical stress. It therefore enjoys improved reliability without the need for underfill that would otherwise be required for stress relief. Since each die would thus be essentially unencapsulated, the package may be rated at higher maximum junction temperatures, allowing for yet higher heat dissipation.

Accordingly, in one embodiment, the present invention provides a multi-chip semiconductor package including: a base layer; a dielectric layer of laminating medium disposed over the base layer; an electrically conductive lead frame layer disposed over the dielectric layer, the lead frame layer being physically divided into a plurality of electrically isolated lead frame sections, each section having a cavity; a plurality of silicon dies each having its substrate attached inside and making electrical contact with a respective cavity; and an inner array of solder balls distributed across an active surface of each of the plurality of silicon dies, and an outer array of solder balls disposed on a surface of cavity edges of the lead frame layers.

In another embodiment, the present invention provides a method for packaging a plurality of silicon dies inside a single package including the steps of: forming a multi-layer carrier having a base layer, a laminating dielectric middle layer and a conductive lead frame upper layer; etching through the lead frame layer to form a plurality of electrically isolated lead frame sections; stamping a cavity inside each of the plurality of electrically isolated lead frame sections; attaching a first surface of a silicon die inside each cavity such that a second surface of the silicon die and a surface of the edges of the lead frame layer adjacent to the silicon die form a substantially uniform plane; and disposing an array of solder balls across the substantially uniform plane with an outer array connecting to the lead frame layer and an inner array connecting to the second surface of the silicon die.

A better understanding of the nature and advantages of the improved multi-chip flip chip package of the present invention may be gained with reference to the detailed description and drawings below.

DESCRIPTION OF THE SPECIFIC EMBODIMENTS

An improved flip chip packaging technology that offers a number of advantages over conventional semiconductor packaging technologies is described in detail in the above-referenced parent application Ser. No. 09/129,663, by R. Joshi. Briefly, according to the improved flip chip technology, a silicon die is attached to a carrier (or substrate) that has a cavity substantially surrounding the die. Direct connection of the active surface of the silicon die to the printed circuit board is then made by an array of solder bumps that is distributed across the surface of the die as well as the edges of the carrier surrounding the die. This eliminates the use of wire bonds or extended lead frames and results in a package that exhibits substantially reduced resistance and superior thermal performance. If the substrate is made large enough, the same manufacturing process can be used to house multiple dies inside one package. There would be one restriction however: with a common substrate, the backsides of the multiple silicon dies would be electrically connected. This limits the circuit applications for the multi-chip package.

Figure 1:
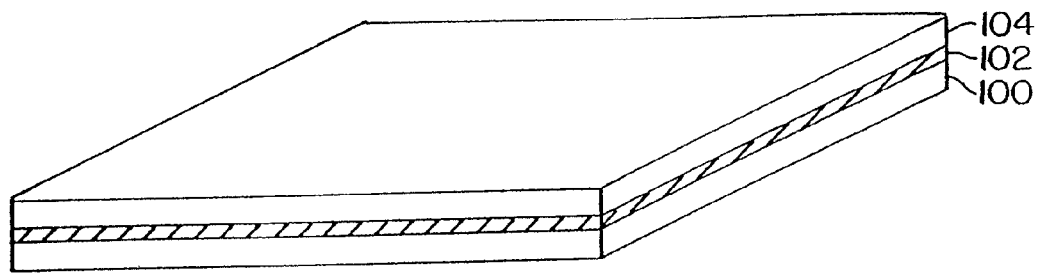
FIG. 1 illustrates a pre-etch base frame-laminate-lead frame sandwich that will provide the multi-chip flip chip housing according to the present invention.

To address this drawback, the present invention offers a multi-layer substrate with electrical isolation to enable the package to house multiple silicon dies with electrically isolated substrate connections. Referring to FIG. 1, the package substrate according to the present invention includes a first base frame 100 that is made of, for example, ceramic, separated from a second lead frame 104 that may be made of, for example, copper, by a non-conductive layer 102 of laminating medium such as epoxy. The purpose of inserting laminating dielectric layer 102 between the two layers is to allow second lead frame layer 104 to be etched into as many electrically isolated regions as desired without compromising the structural integrity of the package. In order to maintain the overall size of the package within the standard dimensions, the thickness of base frame 100 is much reduced as compared to that used in conventional packages to make up for the additional thickness added by layers 102 and 104.

Figure 2:
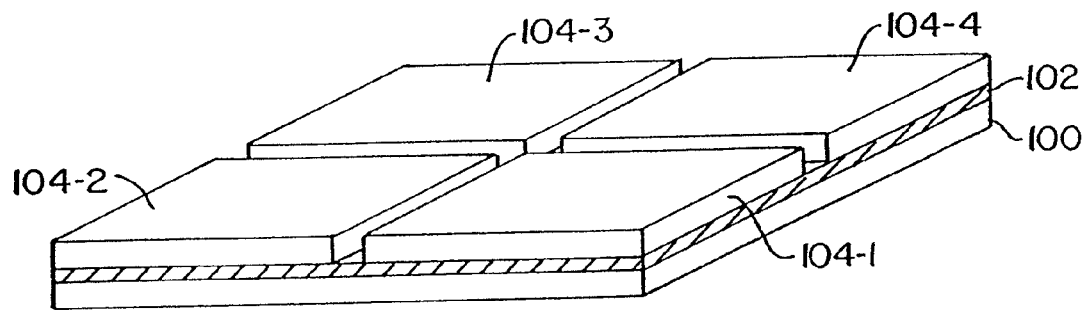
FIG. 2 illustrates a step of creating multiple (4 in the example shown) electrically isolated lead frames separated from a common base frame by a dielectric layer of laminating medium.
Figure 3A:
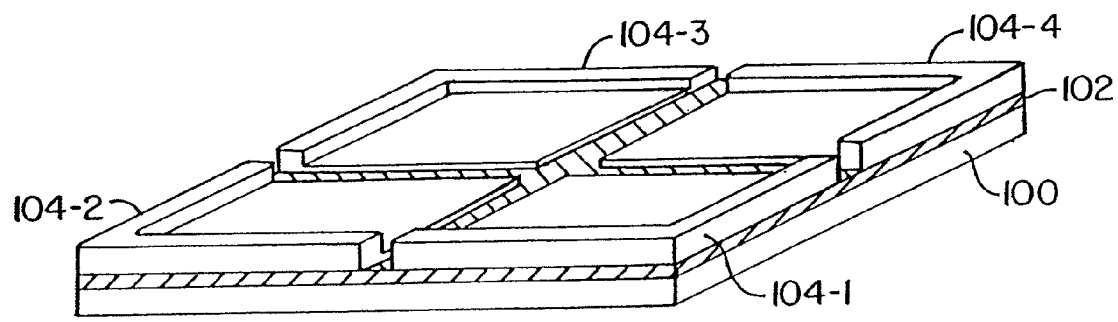
FIGS. 3A and 3B illustrate two different exemplary embodiments for the multi-chip package of the present invention showing multiple electrically isolated lead frames with cavities etched off wherein individual silicon dies are attached.
Figure 3B:
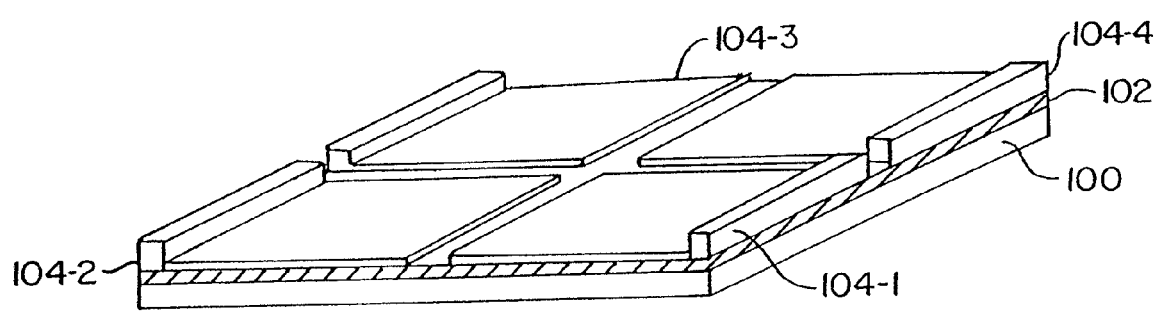

Lead frame 104 is the layer upon which the various silicon dies attach. For illustrative purposes only, the embodiment shown and described herein houses four dies inside the package of the present invention, but it is to be understood that this number could vary depending on the application. As shown in FIG. 2, an intersecting trough is etched into the surface of lead frame 104 all the way down to dielectric laminating layer 102. Thus, four electrically isolated lead frame regions 104-1, 104-2, 104-3, and 104-4 are formed. Each lead frame region 104-i undergoes the improved flip chip process according to the invention. A cavity is etched inside each lead frame region 104-i to house a silicon die. FIG. 3A illustrates the four lead frames with cavities etched off. In the embodiment shown, each lead frame 104-i is etched such that walls surround only the outer edges of the frame. The height of the cavity walls (i.e., the depth of each cavity) is designed to be approximately equal to the thickness of the die (plus the die attach material). To accommodate larger dies, in an alternative embodiment shown in FIG. 3B, lead frame layer 104 is etched off such that only one outer edge includes a wall. Silicon dies are then attached inside each cavity such that the top surface of the die is co-planar with the top surface of the lead frame edges. A variety of well known die attach methods may be used including conductive epoxy, or soft or hard solder connection to attach the silicon dies inside each cavity. Solder balls are then distributed across the top surface of the four dies as well as the surface of the lead frame edges as described in the above-referenced parent application.

Figure 4:
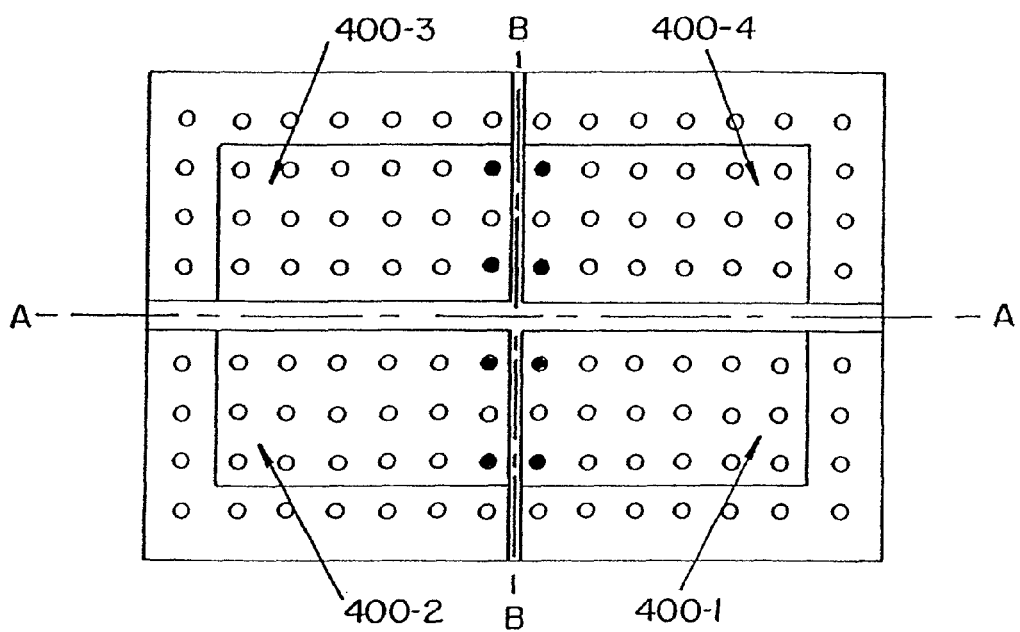
FIG. 4 shows a top view of the exemplary quad chip housing with arrays of solder disposed on the surfaces of the various silicon dies and lead frames according the present invention.
Figure 5:
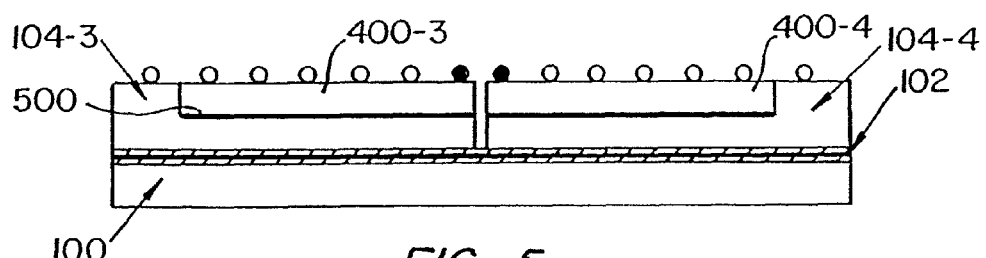
FIG. 5 shows a cross-sectional view of the exemplary quad chip flip chip package of the present invention along the A-A axis of the top view shown in FIG. 4.
Figure 6:
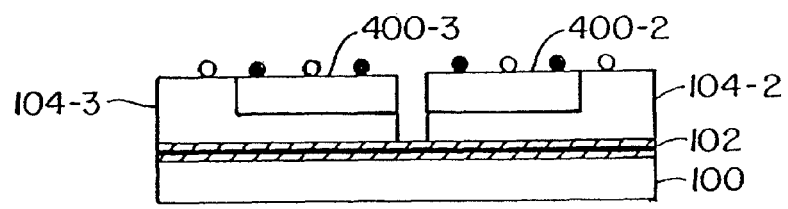
FIG. 6 shows a cross-sectional view of the exemplary quad chip flip chip package of the present invention along the B-B axis of the top view shown in FIG. 4.

Referring to FIG. 4, a top view of the exemplary quad-chip flip chip package is shown with dies 400-1, 400-2, 400-3, and 400-4 attached inside each cavity and an array of solder balls distributed across the top surface. FIG. 5 shows a cross-sectional view of the exemplary quad chip flip chip package of FIG. 4 along the A-A axis. This cross-sectional view depicts all of the various layers of the package of the present invention: common base frame 100 separated from lead frame layer 104 by dielectric laminating layer 102, silicon dies 400 attached inside cavities by die attach material 500, and the array of solder balls on the active surface of each die as well as the edges of lead frame layer 104. FIG. 6 shows a cross-sectional view of the exemplary quad chip flip chip package of FIG. 4 along the B-B axis depicting the various layers from a different angle.

Figure 7:
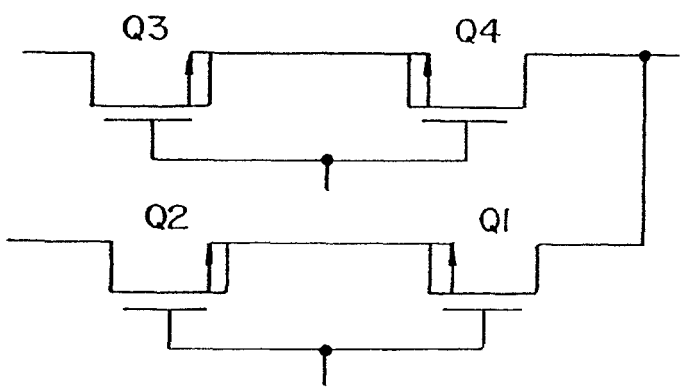
FIG. 7 is a simplified partial circuit schematic showing four power MOSFETs connected in an arrangement that is commonly found in battery charger applications.

The multi-chip flip chip package of the present invention is particularly well suited for discrete products with high heat dissipation such as power switching devices (e.g., power MOSFETs) where electrical connection to the back side of the die (MOSFET drain terminal) is required. By using conductive material such as copper for lead frame 104, the package of the present invention provides for a very low resistance, compact connection between the back side of each die (the drain terminal of power MOSFETs) and the PCB. FIG. 7 is a simplified partial circuit schematic showing four power MOSFETs connected in a bi-directional switch arrangement that is found in battery charger applications. In this particular application, two pairs of power MOSFETs Q1-Q2 and Q3-Q4 have their gate and source terminals connected together as shown. The drain terminals of transistors Q1 and Q4 also connect to a common node, while the drain terminals of transistors Q2 and Q3 connect to separate nodes. It is assumed that each power MOSFET is implemented on a separate silicon die according to known power MOSFET processing technologies such as those developed by Fairchild Semiconductor. This arrangement therefore requires four separate dies. The multi-chip flip chip package of the present invention can house all four of these transistors inside a single, compact and low resistance package.

Figure 8:
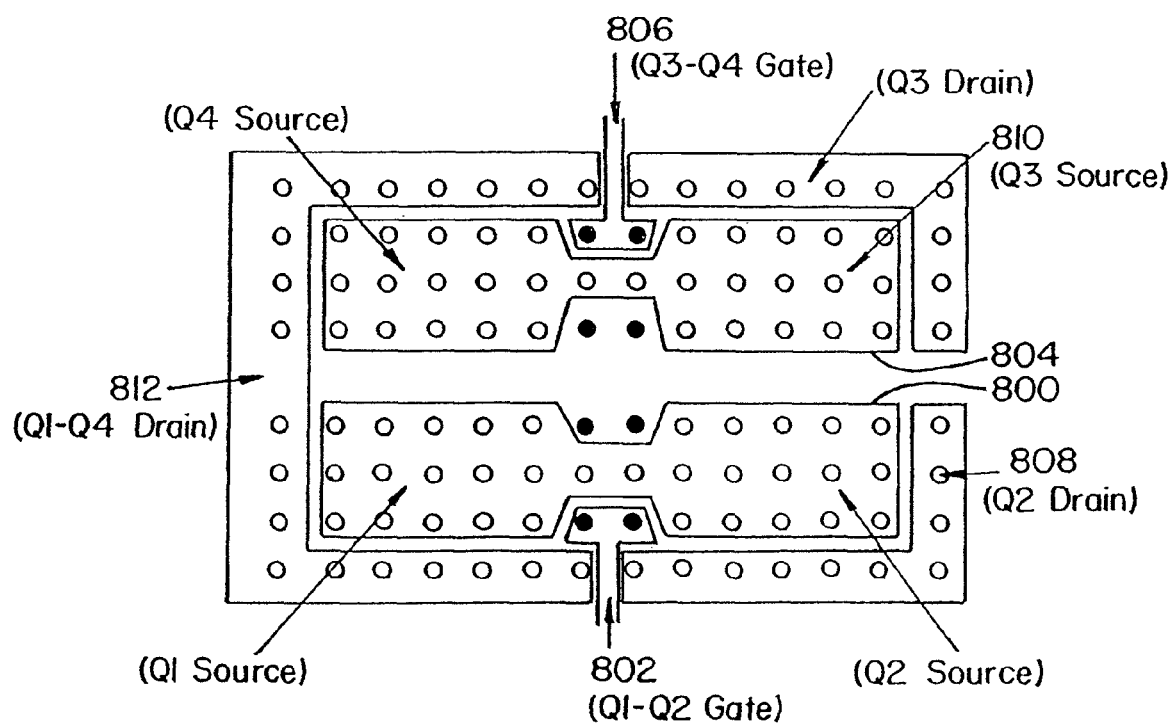
FIG. 8 shows a top view of a board layout for an exemplary embodiment of the multi-chip flip chip package of the present invention for circuit applications such as those shown in FIG. 7.

Referring to FIG. 8, there is shown a top view of the board layout for a multi-chip flip chip package according to the present invention that houses the four power MOSFETs required by the circuit of FIG. 7. According to this exemplary embodiment, the substrate of each MOSFET die is attached to the bottom of each cavity such that the top active surface (source terminal) of each die is co-planar with the top surface of the edges of lead frame layer 104. Once mounted on the board, the solder ball array for the source connection to transistor Q1 connects to the solder ball array for the source connection to transistor Q2 by a common metal plate 800. Gate terminal solder balls for Q1 and Q2 are also commonly connected by metal plate 802. Similarly, the source terminals of Q3 and Q4 are connected by common metal plate 804, while their gate terminals connect at 806. The lead frame edges for transistors Q2 and Q3 form drain terminals of Q2 and Q3 that connect separately at 808 and 810, while the lead frame connections to the drain terminals of transistors Q1 and Q4 connect by a common metal plate 812 as required by the circuit. In an alternative embodiment, the drain terminals of transistors Q1 and Q4 may also be electrically connected inside the package. This is accomplished by etching lead frame 104 into three electrically isolated parts instead of four such that a common lead frame is provided where the substrates of both transistor dies Q1 and Q4 attach.

Thus, the present invention provides a multi-chip package that entirely eliminates the need for the highly resistive conventional wire bonding. The combination of a highly conductive lead frame 104 and a distributed array of solder balls across the surface of the die and the lead frame virtually eliminate the metal resistance by drastically reducing the length of the current path through the metal connections. Another advantage of the multi-chip package of the present invention is that the troughs etched into the upper lead frame layer render the package more flexible and thus more robust against mechanical stress. Thus, underfill my no longer be required for stress relief as the structure of the package of the present invention can withstand higher mechanical stress. This also allows the package to be rated at a higher maximum junction temperature since it is not encapsulated as in a conventional molded package.

The multi-chip flip chip package according to this present invention thus offers a highly compact and low resistance package to house multiple semiconductor dies. The multi-chip aspect of this invention retains the cost-effective and simplified manufacturing process used for the flip chip package described in the above-referenced parent application. That is, a significant advantage of the multi-chip flip chip package of the present invention is that it not only does not introduce any steps that deviate from industry standard practices, it eliminates various steps and simplifies the process of manufacture. Because the process of manufacture for the package of the present invention follows existing standards in the industry (e.g., fine pitch ball grid array standards), the tools and infrastructure necessary to support the package such as sockets, handlers, trays and the like are well established. In terms of simplification of the process of manufacture, the entire assembly process flow for the package of the present invention is reduced to the following steps: 1) wafer saw dicing the wafer into multiple dies; 2) die attach to substrate (lead frame); 3) epoxy encapsulation to seal the edges of each die (optional); 4) solder ball attach (optional as the solder balls may be preattached); 5) test; 6) singulate; and 7) tape and reel. This eliminates the need for costly mold, trim and form equipment and a plating line. Other ball count variations of the package can be easily tooled up with an initial investment in a carrier rather than dedicated items like mold, trim and form tooling that are needed for conventional surface mount packages. This improves time to market for new form factor packages.

In conclusion, the present invention provides a high performance multi-chip flip chip type package that offers a number of advantages over existing packaging techniques. The combination of a die attached inside a cavity of a carrier such that an array of solder balls can be disposed across both surfaces results in a highly compact, low resistance package with a simplified and thus cost effective method of manufacture. The package also improves heat dissipation when the carrier is made of a highly conductive material acting as a thermal via. Housing of multiple dies is facilitated by providing electrically isolated lead frames that are separated from a common carrier by a non-conductive layer of laminating material. While the above is a complete description of the preferred embodiment of the present invention, it is possible to use various alternatives, modifications and equivalents. For example, the specific embodiment described herein shows four electrically isolated lead frames, but the lead frame layer may be etched to form any desired number of electrically isolated substrates for receipt of silicon dies. Nor should the use of power MOSFETs in the example described herein be viewed in any way as limiting the applicability of the multi-chip flip chip package of the present invention to any particular circuit technology. Further, various different manufacturing processes can be used to yield the same or similar structure as that of the multi-chip flip chip package of the present invention. Therefore, the scope of the present invention should be determined not with reference to the above description but should, instead, be determined with reference to the appended claims, along with their full scope of equivalents.

What is claimed is:

1. A method comprising:
forming a carrier having a cavity and made of an electrically conductive material, wherein the formed carrier has a plurality of edge regions formed around a region where a silicon die is to be attached, wherein the silicon die has a first surface and a second surface;
attaching the silicon die to the carrier, the first surface being attached to a surface of the carrier thereby electrically coupling the silicon die to the carrier, the silicon die having a thickness substantially equal to the thicknesses of the edge regions such that the second surface of the silicon die and top portions of the edge regions of the carrier surrounding the silicon die are in a substantially uniform plane; and
attaching conductive structures to the second surface of the silicon die and to the edge regions of the carrier.

2. The method of claim 1 wherein the silicon die comprises a power MOSFET having a drain terminal, a source terminal, and a gate terminal.

3. The method of claim 1 wherein the carrier further comprises a dielectric layer.

4. The method claim 1 wherein a drain terminal of a power MOSFET in the silicon die is coupled to the carrier, and source and gate terminals in the power MOSFET are coupled to the conductive structures at the second surface of the silicon die.

5. The method of claim 1 wherein each edge region is in the form of a wall that has a length substantially equal to a length of an edge of the silicon die.

6. The method of claim 1 wherein there are two edge regions in the form of walls on opposite sides of the semiconductor die.

7. The method of claim 1 wherein the carrier comprises four edge regions in the form of walls surrounding the semiconductor die.

8. The method of claim 1 wherein the carrier comprises copper.

9. The method of claim 8 further comprising depositing a sealing material on at least edges of the silicon die.

10. The method of claim 1 further comprising depositing a sealing material on at least edges of the silicon die.

11. The method of claim 10 wherein the conductive structures are solder balls.

12. The method of claim 1 wherein the conductive structures are solder balls.

13. A method of forming a system including:
forming a package according to the method of claim 1;
flipping the package over; and attaching the package to a circuit board.

14. The method of claim 1 wherein forming the carrier comprises stamping the carrier.

* * * * *